United States Patent
Bunciak et al.

(10) Patent No.: US 11,842,128 B2
(45) Date of Patent: Dec. 12, 2023

(54) SENSORY DATA GENERATOR

(71) Applicant: RED HAT, INC., Raleigh, NC (US)

(72) Inventors: Stefan Bunciak, Brno (CZ); Martin Vecera, Brno (CZ); Miroslav Jaros, Brno (CZ)

(73) Assignee: RED HAT, INC., Raleigh, NC (US)

( * ) Notice: Subject to any disclaimer, the term of this patent is extended or adjusted under 35 U.S.C. 154(b) by 57 days.

(21) Appl. No.: 17/569,165

(22) Filed: Jan. 5, 2022

(65) Prior Publication Data

US 2022/0129604 A1   Apr. 28, 2022

Related U.S. Application Data

(63) Continuation of application No. 16/518,172, filed on Jul. 22, 2019, now Pat. No. 11,232,242.

(51) Int. Cl.
| | |
|---|---|
| *G06F 30/20* | (2020.01) |
| *H04L 67/12* | (2022.01) |
| *G01K 7/00* | (2006.01) |
| *G06F 17/18* | (2006.01) |

(52) U.S. Cl.
CPC .............. *G06F 30/20* (2020.01); *G01K 7/00* (2013.01); *G06F 17/18* (2013.01); *H04L 67/12* (2013.01)

(58) Field of Classification Search
None
See application file for complete search history.

(56) References Cited

U.S. PATENT DOCUMENTS

| | | | |
|---|---|---|---|
| 5,862,364 A | 1/1999 | Todd | |
| 10,943,414 B1 * | 3/2021 | Nygaard | G05D 1/0088 |

| | | | |
|---|---|---|---|
| 2013/0262063 A1 | 10/2013 | Massonat et al. | |
| 2017/0168885 A1 | 6/2017 | Jain et al. | |
| 2018/0114140 A1 | 4/2018 | Chen et al. | |

(Continued)

FOREIGN PATENT DOCUMENTS

CN       106027319 A       10/2016

OTHER PUBLICATIONS

Ivari, A., et al., "Building a Simulation-in-the-loop Sensor Data Testbed for Cloud-enabled Pervasive Applications," 2015, https://ac.els-cdn.com/S1877050915017007/1-s2.0-S1877050915017007-main.pdf?_tid=0c089432-f002-49d5-b9a6-4e53f57554eb&acdnat=1550827878_29f3fa426e990dd25416e331b6f55c04.

(Continued)

*Primary Examiner* — Craig C Dorais
(74) *Attorney, Agent, or Firm* — Kilpatrick Townsend & Stockton LLP

(57) ABSTRACT

Certain aspects and features provide generation or simulation of sensory data that would otherwise come from Internet-of-things (IoT) sensors in reproducible and controllable way. Thus, the response of a system to very large numbers of sensors can be tested without acquiring and deploying a very large number of sensors for test and development purposes. In some examples, a processing device coupled to a network interface identifies a stored function of time describing a locally sensed property for a simulated sensor. The locally sensed property corresponds to at least one event taking place in a virtual environment. The processing device can determine values of an input variable produced by the stored function of time. The values can be wrapped in a communication protocol to produce messages that are transmitted over the network interface.

20 Claims, 5 Drawing Sheets

(56) References Cited

U.S. PATENT DOCUMENTS

| | | |
|---|---|---|
| 2018/0336486 A1 | 11/2018 | Chu et al. |
| 2019/0023529 A1 | 1/2019 | Lau |
| 2019/0043341 A1 | 2/2019 | Wouhaybi et al. |
| 2019/0311087 A1 | 10/2019 | Jackson et al. |

OTHER PUBLICATIONS

Pflanzner, T., et al., "MobIoTSim: Towards a Mobile IoT Device Simulator," 2016, https://core.ac.uk/download/pdf/84774885.pdf.

Chow, DHC., et al., "New Algorithm for generating hourly temperature values using daily maximum, minimum and average values from climate models," Building Serv. Eng. Res. Technol., 2007, pp. 237-248.

L'Ecuyer, P., et al., "SSJ: A Framework for Stochastic Simulation in Java," Proceedings of the 2002 Winter Simulatin Conference, pp. 234-242, https://www.researchgate.net/publication/3997863.

* cited by examiner

SENSORY DATA GENERATOR

CROSS-REFERENCE TO RELATED APPLICATION

This is a continuation of and claims priority to U.S. patent application Ser. No. 16/518,172, filed Jul. 22, 2019, the entire disclosure of which is incorporated herein by reference.

TECHNICAL FIELD

The present disclosure relates generally to simulating sensing devices for testing or research purposes. More specifically, but not by way of limitation, this disclosure relates to generating simulated sensory data that can take the place of sensory data that might otherwise be received from Internet-of-things (IoT) sensors.

BACKGROUND

Internet-of-things (IoT) applications use sensors to collect data for transmission over the Internet to a central resource. Often, transmission is initially through a wired or wireless local area network (LAN) to a local controller or application. In some cases, the data is acted on locally by the local resource. In other cases, the data is forwarded over the Internet to a server. In either case, software or firmware reduces the data into actionable information for users, responds to changes in the data by issuing commands to actuators, or both.

In order to test an IoT application, for example, a home or business automation application or an automation controller, sensors are deployed and connected using wireless techniques like Wi-Fi, WiMAX, ZigBee, Z-Wave, Bluetooth etc. The environment around each sensor is manipulated to cause the sensor to send data over the network. As examples, sensors used with such an application may include temperature sensors, humidity sensors, smoke sensors, heat sensors, moisture sensors, carbon monoxide sensors, and physical position sensors, such as those used to determine the state of a door or window.

DETAILED DESCRIPTION

Figure 1:
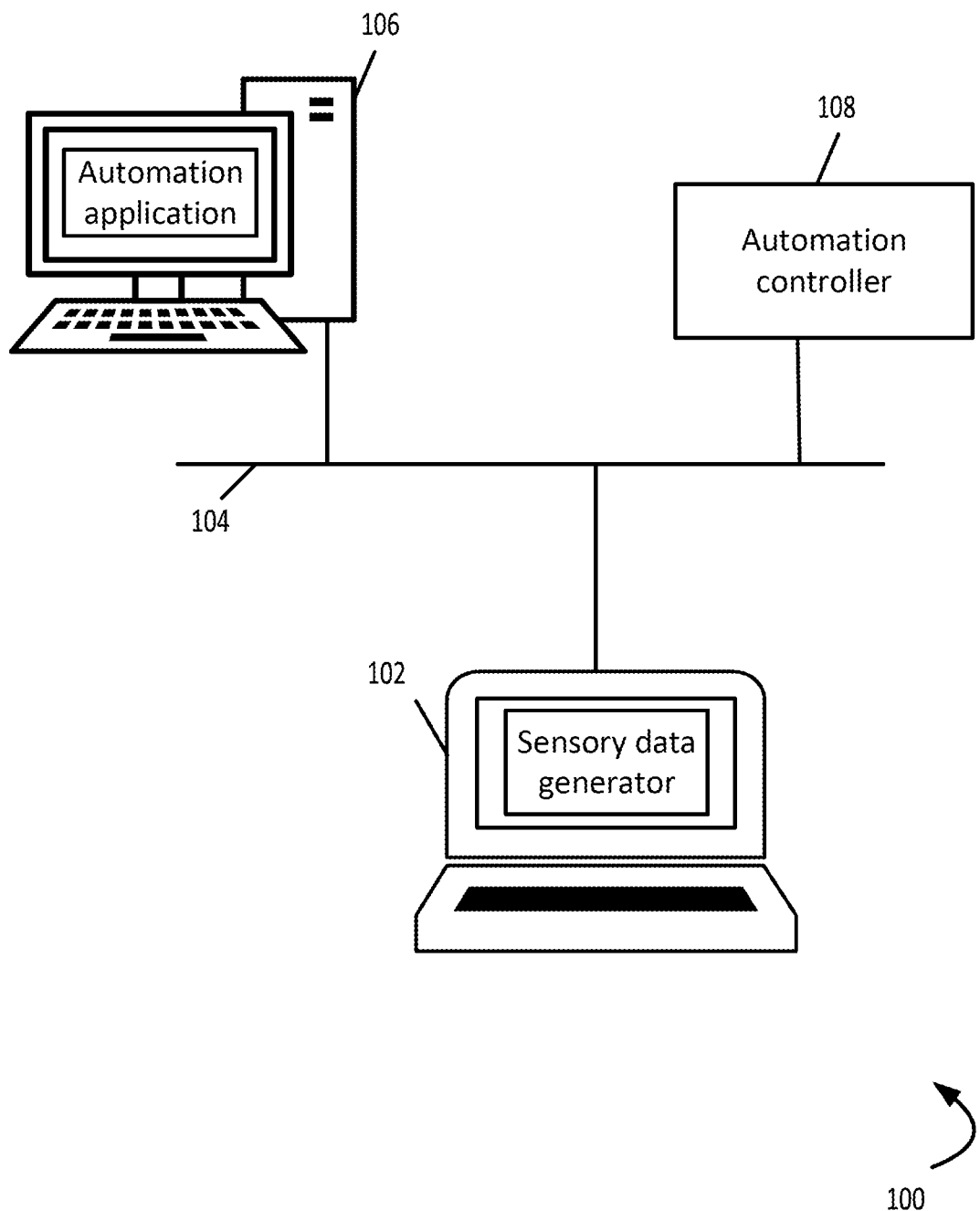
FIG. 1 is a block diagram of an example of a system including a sensory data generator according to some aspects of the disclosure.

In order to test an IoT application or controller, sensors are deployed and connected using wireless techniques like Wi-Fi, WiMAX, ZigBee, Z-Wave, Bluetooth etc. The environment around each sensor is manipulated. As examples, temperature sensors, humidity sensors, smoke sensors, heat sensors, moisture sensors, carbon monoxide sensors, and physical position sensors may need to be deployed and connected to the network. In order to test the response of the application or controller in real-world scenarios, large numbers of sensors must be acquired at substantial cost, and at least some must be environmentally stimulated, requiring a complex setup taking a considerable amount of time to accomplish.

Certain aspects and feature of this disclosure provide generation or simulation of sensory data in a reproducible and controllable way. Certain features and aspects provide this sensory data for any number of sensors near simultaneously. Certain aspects and features take into account the location of sensors, and the different types of responses that can be produced by different types of sensors by using a function of time describing a locally sensed property for a simulated sensor. The locally sensed property can be associated with an event taking place in a broader, virtual environment. Thus, the response of a system to very large numbers of varying kinds of sensors can be tested without the cost and complexity of acquiring and deploying a very large number of physical sensors for test and development purposes.

In some examples, a processing device coupled to a memory executes instructions for causing the processing device to perform operations. The operations include identifying a stored function of time describing a locally sensed property for a simulated sensor. The locally sensed property can be associated with at least one event taking place in a virtual environment The operations further include accessing the stored function of time. The operations additionally include determining values of an input variable produced by the stored function of time. The input variable corresponds to the locally sensed property as prospectively measurable by the simulated sensor in the virtual environment. The operations further include wrapping the values of the input variable within a communication protocol to produce at least one message including the values and transmitting the at least one message.

In some examples, an automation application or controller is coupled to the network interface to receive the at least one message. In some examples, the message is recorded for future use. In some examples, the function of time includes a randomization function, a distribution function, or both. In some examples, the function of time includes a random variate generation function, a quasi-Monte Carlo function, or both. In some examples the function of time includes an increasing function, a sinusoidal function, or both. In some examples, the locally sensed property is or includes temperature and the event includes a wide-spread temperature change. In some examples, a mutator can be invoked to introduce random values of the input variable to simulate unexpected behavior of the simulated sensor These illustrative examples are given to introduce the reader to the general subject matter discussed here and are not intended to limit the scope of the disclosed concepts. The following sections describe various additional features and examples with reference to the drawings in which like numerals indicate like elements but, like the illustrative examples, should not be used to limit the present disclosure.

An event in a virtual environment can be any event that has both spatial and temporal qualities, for example an event that changes in spatial impact over time, such as a fire or natural disaster. The virtual environment can simulate a building, an outdoor area, a vehicle, or any other environment with known characteristics. Due to the complex nature of spatiotemporal events, it can be challenging to test how a software application such as an automation application designed for use with the distributed devices will respond to such events. For example, a software developer may be developing a software application configured to receive inputs from distributed sensors in a real-world environment and respond to such inputs. To fully test the software application, the software developer must necessarily simulate how each type of sensor will behave.

Different kinds of sensors respond in different ways. For example, assuming the virtual environment is a building and the event is a fire, a temperature sensor near the fire would sense an increasing temperature. However, a temperature sensor outside or far away might not see an increase in temperature or might see a much slower increase. A fire door sensor might sense only a change in state, represented by a zero and a one or a connection and no connection to a voltage. The locally sensed property depends not only on the location of the sensor relative to the virtual environment and the event, but also the type of sensor. Therefore, to fully test an application, individual responses of sensors themselves need to be simulated. The general effect of the simulated event is wide-spread, meaning the effect includes a change that impacts multiple sensors, multiple types of sensors, or both. Large numbers of sensors may be simulated in order to properly simulate a large-scale deployment. A locally sensed property, however, is based on the sensor's individual response.

FIG. 1 is a block diagram of an example of a system 100 in which a sensory data generator according some aspects is used. System 100 includes sensory data generator 102, in this example, a laptop or notebook computer executing the operations of the sensory data generator according certain aspects of this disclosure. Sensory data generator 102 is connected to a wired or wireless local area network 104. Also connected to local area network 104 is a computing device 106, and an automation controller 108. The automation controller in this example is an embedded system including firmware that enables an embedded processor to consume IoT sensor messages received over local area network 104 and act according to programmed logic. Computing device 106 is a desktop computer or workstation, which is running an automation application that enables its processor to consume IoT sensor messages received over local area network 104 and act according to programmed logic. System 100 includes both a dedicated, embedded system and a workstation with an appropriate application for illustrative purposes only. Often a system such as system 100 of FIG. 1 would be set up to test one or the other only. Alternatively, a system like system 100 could have additional decisioning applications or systems.

Figure 2:
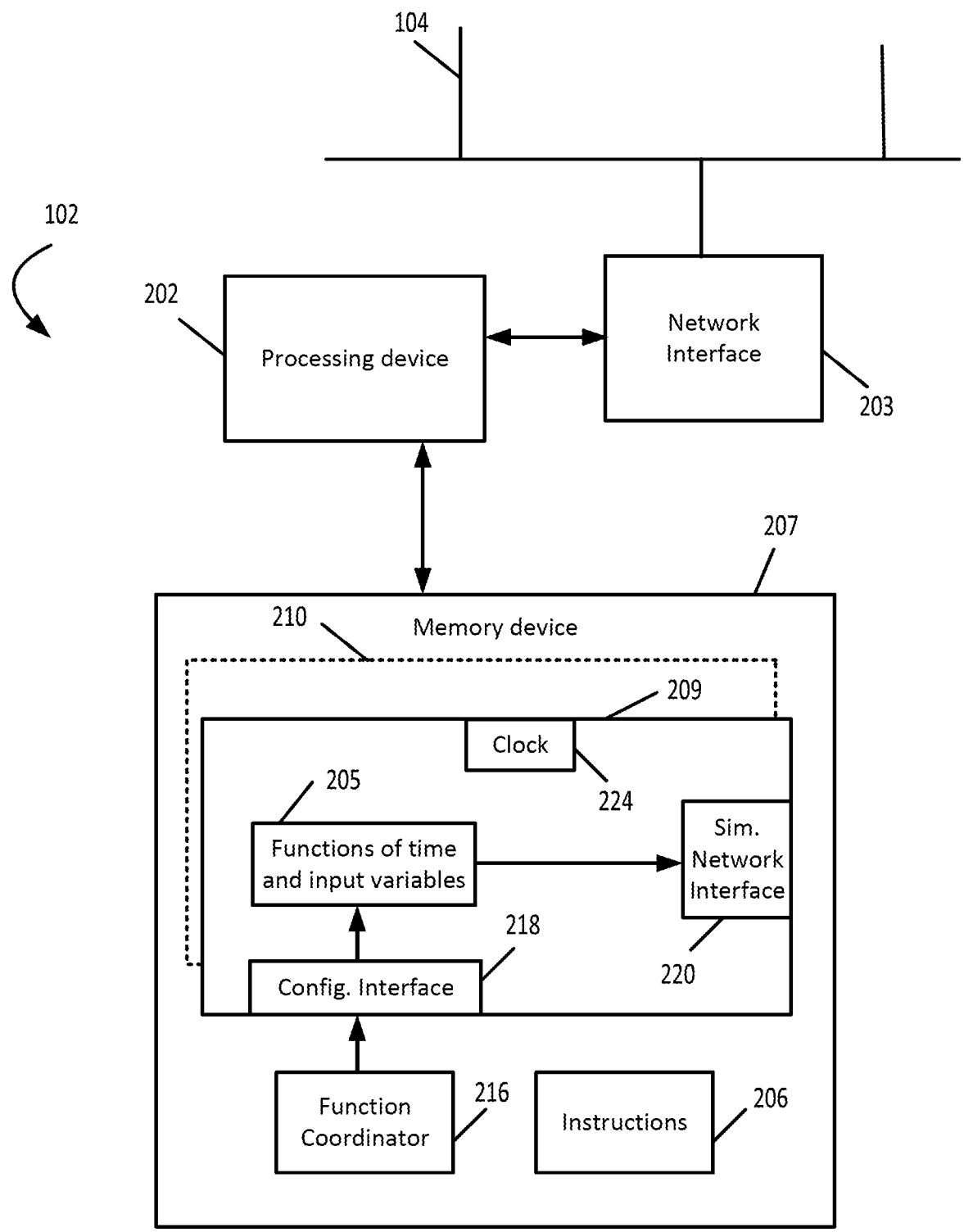
FIG. 2 is a block diagram of an example of a sensory data generator according to some aspects of the disclosure.

FIG. 2 is a block diagram of sensory data generator according to some aspects of the disclosure. The sensory data generator 102 is shown connected to local area network 104. Processing device 202 can execute computer program code, also referred to as instructions or program code instructions 206, executable by the processing device for performing operations of the sensory data generator according to aspects of this disclosure. Processing device 202 is communicatively coupled to network interface 203 and to the memory device 207. The processing device 202 can include one processing device or multiple processing devices. Non-limiting examples of the processing device 202 include a field-programmable gate array (FPGA), an application-specific integrated circuit (ASIC), a microprocessor, etc. The processing device 202 can execute one or more operations for running a sensory data generator as directed by program code instructions 206 stored in the memory device 207. The processing device 202 causes messages following a communication protocol to be sent through network interface 203 to applications or controllers running on local area network 104.

Still referring to FIG. 2, memory device 207 can include one memory device or multiple memory devices. The memory device 207 can be non-volatile and may include any type of memory device that retains stored information when powered off. In some examples, at least some of the memory device can include a non-transitory computer-readable medium from which the processing device 202 can read instructions 206. A computer-readable medium can include electronic, optical, magnetic, or other storage devices capable of providing the processing device with computer-readable instructions 206 or other program code. Non-limiting examples of the memory device 207 include electrically erasable and programmable read-only memory (EEPROM), flash memory, or any other type of non-volatile memory. Non-limiting examples of a computer-readable medium include magnetic disk(s), memory chip(s), ROM, random-access memory (RAM), an ASIC, a configured processor, optical storage, or any other medium from which a computer processor can read instructions. Although FIGS. 1 and 2 depict a certain arrangement of components for illustrative purposes, other examples can include any number and combination of these components arranged in any suitable configuration.

Continuing with FIG. 2, memory device 207 includes data defining a simulated sensor 209. The simulated sensor includes stored functions 205 of time and input variables that represent locally sensed properties that would be prospectively measurable by actual sensors in a virtual environment being simulated. The system can also include a stored communication protocol. The stored communication protocol can define messages that can be consumed and understood by an application or controller being tested, for example, automation controller 108 or the automation application running on computing device 106 as shown in FIG. 1. Examples of communication protocols used with IoT devices include message queuing telemetry transport (MQTT) protocol and Internet protocols such as HTTP when configured for representative state transfer (REST). In some examples, additional simulated sensors 210 are included to simulate large-scale deployments in a virtual environment. In such a case, a locally sensed property is identified for each of many simulated sensors in a deployment distributed throughout the virtual environment.

Staying with FIG. 2, memory device 207 further includes a function coordinator 216. The function coordinator 216 identifies the particular function of the stored functions of time to simulate the locally sensed property of interest for each simulated sensor, based on the event and the environment. As an example, the simulated sensor 209 receives this selection over simulated configuration interface 218. The simulated sensor 209 outputs data values over simulated network interface 220. The reaction time and output timing may be determined by simulated clock 224, which replicates the clock of the real-world sensor being simulated.

Figure 3:
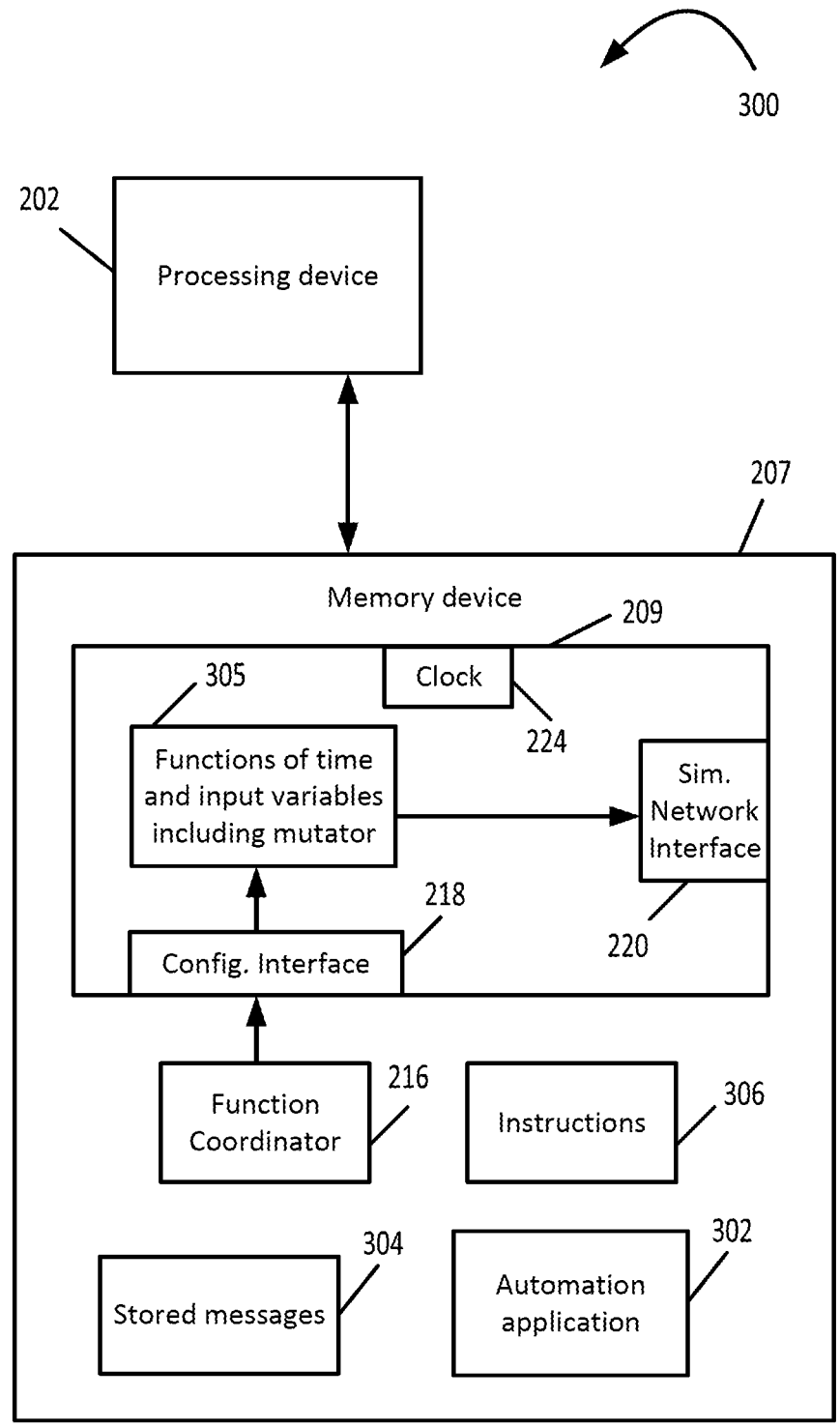
FIG. 3 is a block diagram of another example of a sensory data generator according to some aspects of the disclosure.

FIG. 3 is a block diagram of another sensory data generator system 300 according to some aspects of the disclosure. The sensory data generator system 300 is not connected to local area network as in previous examples. Processing device 202 can execute computer program code, also referred to as instructions or program code instructions 306, for performing operations of the sensory data generator according to aspects of this disclosure. In this example, the processing device 202 causes messages following a communication protocol to be sent only through the internal bus or the memory of the computing device that includes the processing device 202. Such a computing device can take the form of a notebook or desktop computer system or workstation, such as the computing device acting as sensory data generator 102 or computing device 106 shown in the example of FIG. 1.

Still referring to FIG. 3, in some examples, at least some of the memory device can include a non-transitory computer-readable medium from which the processing device 202 can read instructions 306. Memory device 207 includes data defining a simulated sensor 209. The simulated sensor includes stored functions 305. These stored functions include time and input variables that represent locally sensed properties that would be prospectively measurable by actual sensors in a virtual environment being simulated. In this example, stored functions 305 also include a mutator, which can be invoked to introduce random values into the sensor data to simulated unexpected behavior, as might be encountered when a sensor malfunctions due to a harsh environment. As before, simulated sensor 209 also includes configuration interface 218, simulated network interface 220, and clock 224. Also as before, function coordinator 216 identifies the appropriate stored function of time.

Memory device 207 of sensory data generator system 300 can include a stored communication protocol that defines messages that can be consumed and understood by the premises automation application 302, which is being tested by running it on the same computing device that includes processing device 202, memory device 207, and instructions 306.

Continuing with FIG. 3, processing device 202 of sensory data generator system 300 includes stored messages 304. Stored messages 304 can include copies of messages previously consumed by premises automation application 302. A combination of a message log and queued messages for consumption can be included in stored messages 304. Examples of the messaging protocol used include MQTT or HTTP messages as previously discussed.

Figure 4:
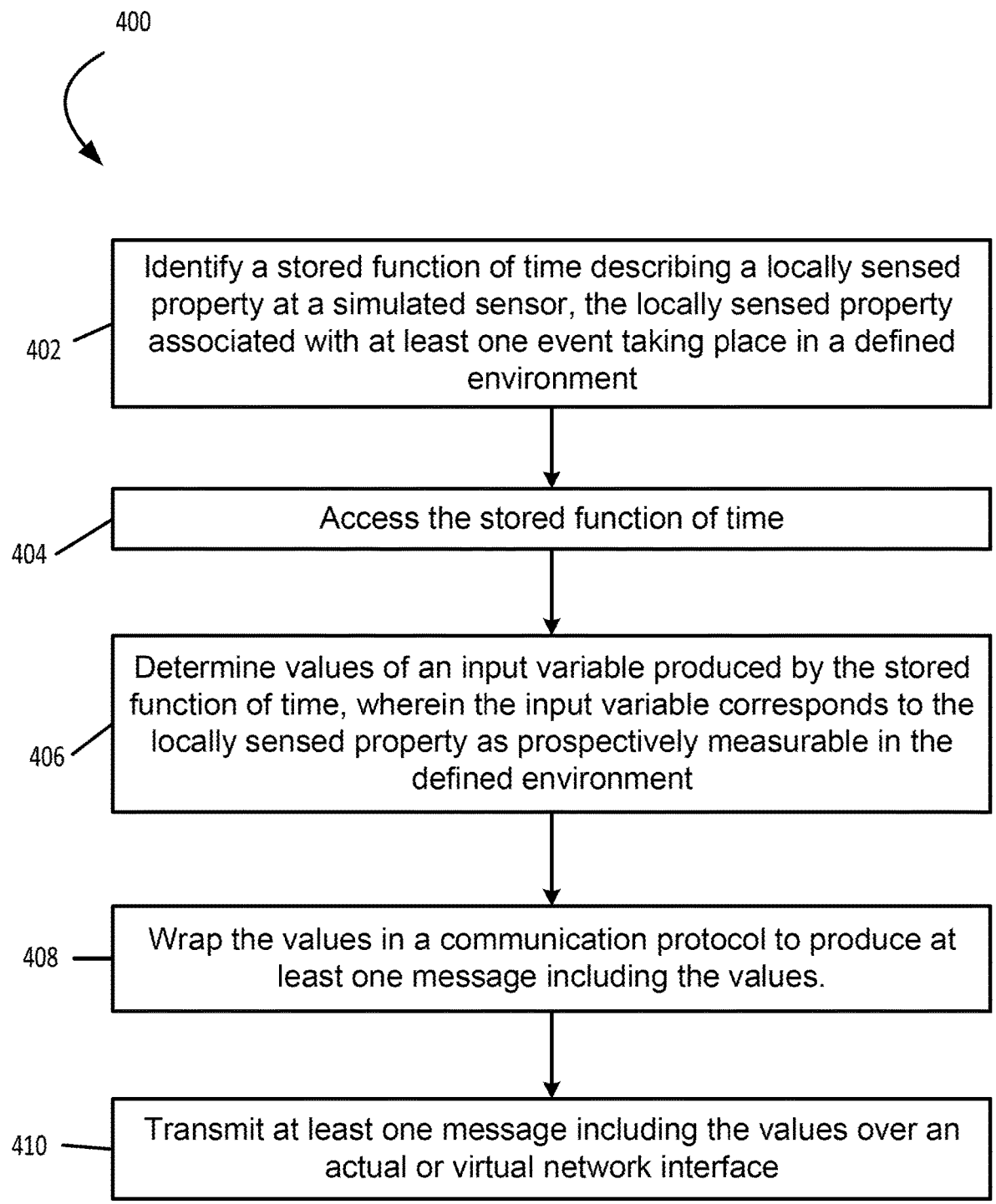
FIG. 4 is a flowchart of an example of a process of sensory data generation according to some aspects of the disclosure.

In some examples, a processing device (e.g., processing device 202) can perform one or more of the operations shown in FIG. 4 to provide a sensory data generator according to some aspects of the disclosure. In other examples, the computing device can implement more operations, fewer operations, different operations, or a different order of the operations depicted in FIG. 4. Process 400 of FIG. 4 is described below with reference to components discussed above.

At block 402, processing device 202 identifies a stored function of time describing a locally sensed property at a simulated sensor. The locally sensed property corresponds to at least one event taking place in the virtual environment. At block 404, processing device 202 accesses the stored function of time. At block 406, processing device 202 determines values of the input variable produced by the stored function of time. The input variable corresponds to the locally sensed property as prospectively measurable in the virtual environment. By prospectively measurable, what is meant is that the input variable varies to represent changes in a property that would be expected by a physical sensor in a real environment like the virtual environment for the simulation. The characteristics of the real event can be known based on past events or can be projected based on simulating events anticipated in the future.

Still referring to FIG. 4, at block 408, the processing device wraps the values in a communication protocol to produce at least one message including the values. At block 410, the processing device 202 transmits at least one message over the network interface, such as network interface 203. The message includes one or more of the values. The message can be transmitted over an actual network interface or be virtually transmitted over a network interface by being sent over an internal bus or written to memory for consumption by an application running concurrently on a computing device. The application can also be running in a virtual machine.

As examples, a function of time as mentioned above can be a randomization function or a distribution function. Randomization of values can be achieved using Java classes from a Java library known as stochastic simulation in Java (SSJ). Classes within this library can provide random number generators with multi-dimensional distributions as well as non-uniform random variate generation. Additional classes can generate quasi-Monte Carlo point sets and sequences. These randomization functions can simulate various kinds of IoT sensor data.

The nature of the distribution function used depends on the type of sensor being simulated. As an example, temperature sensors can be simulated. Typically, the situational event simulated for temperature sensors is a temperature change. For purposes of this disclosure, such an event includes not only a sudden change, but also a change over time such as, in the case of a temperature sensor, heating and cooling over a period of days or even longer. In the case of temperature, an increasing function can be used to simulate a rise in temperature resulting from a nearby fire or from an intentional heating system such as an oven or piece of industrial equipment designed to heat material in a manufacturing process.

A sinusoidal function of time can be used to simulate the measurable property of temperature that would be detected by a sensor where atmospheric temperature changes over time with the heating and cooling of each day. The equation terms can be stored and the equation can be executed by the processing device. For example, hourly temperatures T(t) can be calculated using the equation:

$$T(t) = f_1 T_{MIN} + f_2 T_{MAX}.$$

$f_1$ and $f_2$ are factors specified as follows.

For $t < t_{min}$:

$$f_1 = \frac{\cos(\pi(t_{min} - t)/24 + t_{min} - t_{max}) + 1}{2}.$$

For $t_{min} < t < t_{max}$:

$$f_1 = \frac{\cos(\pi(t - t_{min})/t_{max} - t_{min}) + 1}{2}.$$

For $t_{min} < t$:

$$f_1 = \frac{\cos(\pi(24 + t_{min} - t)/24 + t_{min} - t_{max}) + 1}{2}.$$

Also:

$$f_1 + f_2 = 1.$$

Equations like that above produce sinusoidal data for one day. In order to link days together to simulate a multiday temperature event without steps in the sinusoidal function, $T_{MAX}$ of any day can be linked with $T_{MIN}$ of the following day using a sinusoidal curve as calculated by the equation:

$$T(t) = \left(\frac{Temp_{(next)} + Temp_{(prev)}}{2}\right) -$$

-continued $$\left[\left(\frac{Temp_{(next)} - Temp_{(prev)}}{2}\right)\cos\left(\frac{\pi(r - r_{(prev)})}{r_{(next)} - r_{(prev)}}\right)\right],$$

where terms with the subscript (next) represent the next known value and terms with the subset (prev) represent the previous known value. Average temperature value points can be determined using a quarter-sine method. It is also possible for functions 205 to be described by stored lookup tables. A lookup table for a given sensor can, as an example, list many specific times and a temperature value for each.

Figure 5:
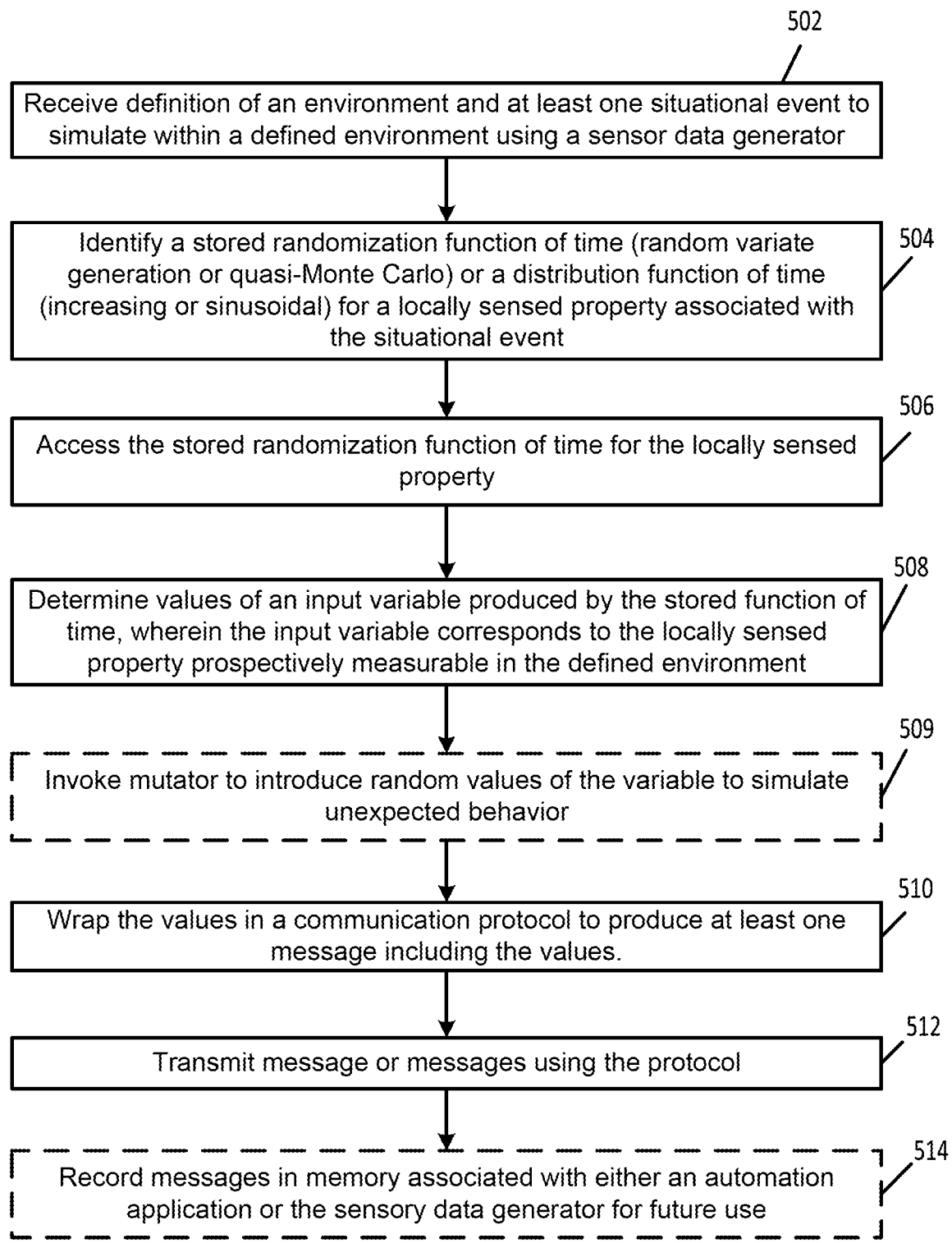
FIG. 5 is a flowchart of another example of a process of sensory data generation according to some aspects of the disclosure.

As another example of the operation of a sensory data generator described above, a computing device can perform the operations of process 500 shown in FIG. 5 to provide sensory data based on specific kinds of functions. In this example, processing device 202 can perform these operations.

At block 502, processing device 202 receives a definition of an environment and at least one situational event to simulate within a virtual environment using a sensor data generator. A situational event for purposes of this example is any event that can occur in the virtual environment that is to be simulated. The definitions of the environment and the situational event can be supplied from a storage device such as memory device 207 or can be received through user input. At block 504, the processing device identifies a stored function of time using function coordinator 216. As examples, the function can be a stored randomization function of time or a distribution function of time (increasing or sinusoidal) for a locally sensed property corresponding to the situational event. As further examples, the randomization function can be a random variate generation function or quasi-Monte Carlo function. A distribution function can be increasing or sinusoidal. This function can be stored in memory device 207. The function can be stored as the terms of an equation or as a look-up table.

Continuing with FIG. 5, at block 506, processing device 202 accesses the stored function for the locally sensed property for example, from memory device 207. At block 508, processing device 202 determines values of an input variable produced by the stored function of time, wherein the input variable corresponds to the locally sensed property prospectively measurable in the virtual environment by a simulated sensor. To simulate large-scale IoT deployments, a locally sensed property is identified for each of many simulated sensors in a deployment distributed throughout the virtual environment. At block 509, a mutator is optionally invoked to introduce random values of the sensor variable in order to simulate unexpected behavior, as might result from sensor malfunctions caused by high heat, extreme vibration, or other harsh environments initiated by disaster events. A mutator is a process used to control the value of a variable. In this example, the mutator is used to force the value of the variable outside its normal range, which is the range that would otherwise be dictated by the stored function of time.

At block 510, the values determined at block 508 are wrapped in the selected communication protocol to produce a message or messages including the values. At block 512, the message is or the messages are transmitted. This transmission can be actual, for example, over network interface 203 and local area network 104. The transmission can alternatively be virtual. At block 514 the messages can optionally be recorded for analysis or further use. The messages can be recorded either in memory device 207 associated with the sensory data generator, or in a memory device associated with an automation controller such as automation controller 108 or a remote automation application such as one installed on computing device 106.

Unless specifically stated otherwise, it is appreciated that throughout this specification that terms such as "operations," "processing," "computing," "accessing," and "determining" or the like refer to actions or processes of a computing device, such as one or more computers or a similar electronic computing device or devices that manipulate or transform data represented as physical electronic or magnetic quantities within memories, or other information storage devices, transmission devices, or display devices of the computing platform. The order of the blocks presented in the examples above can be varied—for example, blocks can be re-ordered, combined, or broken into sub-blocks. Certain blocks or processes can be performed in parallel. Terms such as "less" or "greater," when referring to numerical comparisons, whether expressed textually or mathematically, can encompass the concept of equality.

The foregoing description of certain examples, including illustrated examples, has been presented only for the purpose of illustration and description and is not intended to be exhaustive or to limit the disclosure to the precise forms disclosed. Numerous modifications, adaptations, and uses thereof will be apparent to those skilled in the art without departing from the scope of the disclosure.

The invention claimed is:

1. A method comprising:
identifying a spatiotemporal event in a virtual environment that includes a plurality of simulated sensors;
generating sensory data controlled by a delay, wherein the delay is based on a value of a simulated clock signal, the sensory data for a locally sensed property corresponding to an impact of the spatiotemporal event at locations corresponding to the plurality of simulated sensors in the virtual environment;
generating, by a processing device, values for the locally sensed property to simulate unexpected behavior of at least one failing sensor among the plurality of simulated sensors; and
transmitting, controlled by the delay, at least one message including the values and the sensory data to simulate the spatiotemporal event.

2. The method of claim 1, further comprising:
receiving the at least one message by an automation application or controller;
recording the at least one message by the automation application or controller; and
applying programmed logic by the automation application or controller to simulate a reaction to the spatiotemporal event.

3. The method of claim 1, further comprising generating the simulated clock signal.

4. The method of claim 1, further comprising accessing a function of time defining the sensory data, wherein the function of time comprises at least one of a random variate generation function, a quasi-Monte Carlo function, an increasing function or a sinusoidal function.

5. The method of claim 4, further comprising accessing a plurality of stored functions of time including the function of time, the plurality of stored functions of time describing a plurality of varied, locally sensed properties, each of the varied, locally sensed properties corresponding to at least one of the plurality of simulated sensors.

6. The method of claim 5, wherein the plurality of varied, locally sensed properties comprises temperature and the spatiotemporal event comprises a wide-spread temperature change.

7. The method of claim 1, further comprising invoking a mutator function to generate the values for the locally sensed property to simulate the unexpected behavior.

8. A system comprising:
a network interface;
a processing device communicatively coupled to the network interface; and
a memory device including instructions that are executable by the processing device for causing the processing device to perform operations comprising:
identifying a spatiotemporal event in a virtual environment that includes a plurality of simulated sensors;
generating sensory data controlled by a delay, wherein the delay is based on a value of a simulated clock signal, the sensory data for a locally sensed property corresponding to an impact of the spatiotemporal event at locations corresponding to the plurality of simulated sensors in the virtual environment;
generating values for the locally sensed property to simulate unexpected behavior of at least one failing sensor among the plurality of simulated sensors; and
transmitting, controlled by the delay and using the network interface, at least one message including the values and the sensory data to simulate the spatiotemporal event.

9. The system of claim 8, further comprising an automation application or a controller, the automation application or controller configured to record the at least one message and apply programmed logic to simulate a reaction to the spatiotemporal event.

10. The system of claim 8, wherein the operations further comprise generating the simulated clock signal.

11. The system of claim 8, wherein the operations further comprise accessing a function of time defining the sensory data, wherein the function of time comprises at least one of a random variate generation function, a quasi-Monte Carlo function, an increasing function or a sinusoidal function.

12. The system of claim 11, wherein the operations further comprise accessing a plurality of stored functions of time including the function of time, the plurality of stored functions of time describing a plurality of varied, locally sensed properties, each of the varied, locally sensed properties corresponding to at least one of the plurality of simulated sensors.

13. The system of claim 12, wherein the plurality of varied, locally sensed properties comprises temperature and the spatiotemporal event comprises a wide-spread temperature change.

14. The system of claim 8, wherein the operations further comprise invoking a mutator function to generate the values for the locally sensed property to simulate the unexpected behavior.

15. A non-transitory computer-readable medium comprising program code that is executable by a processing device for causing the processing device to:
identify a spatiotemporal event in a virtual environment that includes a plurality of simulated sensors;
generate sensory data controlled by a delay, wherein the delay is based on a value of a simulated clock signal, the sensory data for a locally sensed property corresponding to an impact of the spatiotemporal event at locations corresponding to the plurality of simulated sensors in the virtual environment;
generate values for the locally sensed property to simulate unexpected behavior of at least one failing sensor among the plurality of simulated sensors; and
transmit controlled by the delay, over a network interface, at least one message including the values and the sensory data to simulate the spatiotemporal event.

16. The non-transitory computer-readable medium of claim 15, wherein the program code is executable for causing the processing device to generate the simulated clock signal.

17. The non-transitory computer-readable medium of claim 15, wherein the program code is executable for causing the processing device to access a function of time defining the sensory data, wherein the function of time comprises at least one of a random variate generation function, a quasi-Monte Carlo function, an increasing function or a sinusoidal function.

18. The non-transitory computer-readable medium of claim 17, wherein the program code is executable for causing the processing device to access a plurality of stored functions of time including the function of time, the plurality of stored functions of time describing a plurality of varied, locally sensed properties, each of the varied, locally sensed properties corresponding to at least one of the plurality of simulated sensors.

19. The non-transitory computer-readable medium of claim 18, wherein the plurality of varied, locally sensed properties comprises temperature and the spatiotemporal event comprises a wide-spread temperature change.

20. The non-transitory computer-readable medium of claim 15, wherein the program code is executable for causing the processing device to invoke a mutator function to generate the values for the locally sensed property to simulate the unexpected behavior.

* * * * *